United States Patent [19]

Whitley

[11] Patent Number: 4,859,932
[45] Date of Patent: Aug. 22, 1989

[54] MULTI-FUNCTION TESTER

[76] Inventor: William E. Whitley, 312 York St., Suffolk, Va. 23434

[21] Appl. No.: 273,548

[22] Filed: Nov. 21, 1988

[51] Int. Cl.⁴ ............................................. G01R 31/02
[52] U.S. Cl. .................................. 324/72.5; 324/500; 324/537; 324/556; 324/133; 340/652
[58] Field of Search ................ 324/72.5, 72, 133, 543, 324/539, 540, 66, 555, 556, 500, 537; 340/652, 654; 379/26, 33

[56] References Cited

U.S. PATENT DOCUMENTS

| | | | |
|---|---|---|---|
| 3,288,929 | 11/1966 | Hutchinson | 324/539 X |
| 3,290,586 | 12/1966 | Anderson | 324/519 |
| 3,639,833 | 2/1972 | Tachick | 324/556 |
| 3,831,089 | 8/1974 | Pearce | 324/133 X |
| 4,027,236 | 5/1977 | Stewart | 324/556 |
| 4,207,558 | 6/1980 | Kunzer | 340/524 |
| 4,321,530 | 3/1982 | Kelly et al. | 324/133 X |
| 4,410,850 | 10/1983 | Pesto et al. | 324/519 |

Primary Examiner—Reinhard J. Eisenzopf
Assistant Examiner—Robert W. Mueller
Attorney, Agent, or Firm—Griffin, Branigan & Butler

[57] ABSTRACT

A multi-function tester (10) for testing electrical continuity and detecting the presence of various types of voltages comprises a bistable flip flop (14) having set and reset input terminals (2, 6) which are driven by voltage changes thereat to change the level of voltage appearing at an output terminal (3), with the set input terminal being coupled to a voltage source (12) through a set resistor (30) and being coupled to a common terminal (26) through a TMOS FET switch (16). An LED (32) is connected between the flip flop output terminal and the common terminal. A storage switch (18) couples and decouples the set and reset terminals. A voltage probe (20) coupled to the DC voltage source, a common probe (22), coupled to the common terminal, and a switch probe (24), coupled to a switching terminal (38) of the TMOS FET are used to place voltage signals on the switching terminal, both directly and through other circuits, for changing a switching impedance of the TMOS FET and thereby changing the voltage at the set and reset input terminals for changing the state of the flip flop and thereby activating and deactivating the LED.

11 Claims, 1 Drawing Sheet

MULTI-FUNCTION TESTER

BACKGROUND OF THE INVENTION

This invention relates broadly to the art of electricity measuring and testing, and more specifically, to circuits for detecting electrical continuity and the presence of various voltages.

The most common type of continuity tester includes a voltage source for producing a current through a circuit to be tested and an indicator for indicating the flow of the current. However, such a continuity tester utilizes too much electrical energy and is too limited in application. With regard to limits to its application, such a continuity tester will only indicate if there is discontinuity in a circuit and will not provide an indication as to the location of the discontinuity. For these reasons, it is an object of this invention to provide a continuity indicator which utilizes very little current but yet not only provides an indication as to continuity, but also provides an indication as to the location of a break in an electrical circuit.

Most prior-art voltage-presence testers provide an indicator, such as a light, which is activated by the passage of an electrical current through two probes attached to opposite terminals of an electrical circuit being tested. When the electrical circuit produces a voltage, electrical current passes through the probes and the indicating device indicates that this voltage is present. However, most prior-art voltage-presence testers are too limited in application in that they will not respond to small spikes of voltage, they will not provide an indication as to the polarity of the voltage, they will not provide an indication of the type of voltage (AC or DC), and they will not provide an indication of the size of the voltage. In addition, many such voltage-presence testers are unduly sensitive and will be damaged by voltages higher than 350 volts. It is an object of this invention to provide a voltage-presence detector which will provide an indication of both very small and very large voltages, will provide an indication of the presence of voltage spikes, will provide an indication of the polarity of a DC voltage, will provide an indication of the type of voltage (AC or DC), and will provide an indication of the size of a voltage. In addition, it is an object of this invention to provide such a voltage-presence detector which is not unduly sensitive and will not be damaged by voltages as high as 1000 volts.

Yet another difficulty with many prior-art voltage presence testers is that they will not store an indication for informing an operator thereof at a later time. This is a disadvantage because when an operator is working alone, he may need to be at a first end of a circuit to send a pulse voltage while his voltage-presence tester is at the other end. In other words, the operator cannot look at the voltage-presence tester at the same time he is sending the pulse voltage in the circuit. This occurs, for example, when someone is testing a doorbell circuit and has the voltage tester at a power box while he is pressing a doorbell button. Thus, it is an object of this invention to provide a voltage-presence tester which will store a voltage-presence indication for a period of time. However, it is also an object of this invention to provide such a voltage tester which is relatively uncomplicated and inexpensive to manufacture.

Yet another difficulty with many prior-art voltage-presence detectors is that two probes thereof must be brought into contact with opposite ends of a circuit in order to get an indication therefrom. That is, one probe has to be attached to a negative terminal of the circuit and the other probe must be attached to a positive terminal of the circuit. Such a shortcoming is quite burdensome because, in some cases it is difficult to gain access to both terminals of a circuit. Also, it is advantageous to be able to determine which of two terminals of a circuit is a "hot" terminal and which is a ground, or common, terminal. For this reason, it is another object of this invention to provide a voltage-presence tester which can work both by having access to two terminals and by having access to only one terminal. Again, it is an object of this invention to provide such a voltage-presence tester which is uncomplicated and relatively inexpensive.

SUMMARY

According to principles of this invention, a continuity and voltage-presence tester comprises a bistable flip flop whose set input terminal is coupled to a voltage source through a set resistor and to a common terminal through a voltage steerable switch and whose output terminal is coupled to the common terminal through an indicator device. A voltage probe is attached to the voltage source, a common probe is attached to the common terminal, and a switching probe is attached to a switching terminal of the voltage steerable switch. The probes are used to place voltage signals on the switching terminal, both directly and through other circuits, for changing a switching impedance of the switch to thereby change the voltage at the flip flop circuit set input terminal for causing the flip flop to change to a first state for activating the indicator device to produce a detectable output. In this regard, a reset terminal of the flip flop is driven by a voltage change in the opposite sense than the set input terminal to extinguish the indicator device. A storage switch is coupled between the set and reset terminals for allowing the flip flop to operate in either a non-storage or a storage mode. When the storage switch is closed the indicator device will indicate the presence or absence of a switching signal at the switching terminal of the voltage steerable switch, however, when the storage switch is open, an impulse voltage signal at the switching terminal will cause the flip flop to move to the first state for activating the indicator device and the flip flop will stay in this first state to maintain, or store, this indication even when the voltage is removed from the switching terminal.

BRIEF DESCRIPTION OF THE DRAWINGS

The foregoing and other objects, features and advantages of the invention will be apparent from the following more particular description of a preferred embodiment of the invention, as illustrated in the accompanying drawings in which reference characters refer to the same parts throughout the different views. The drawings are not necessarily to scale, emphasis instead being placed, upon illustrating principles of the invention in a clear manner.

DESCRIPTION OF THE PREFERRED EMBODIMENT

Figure 1:
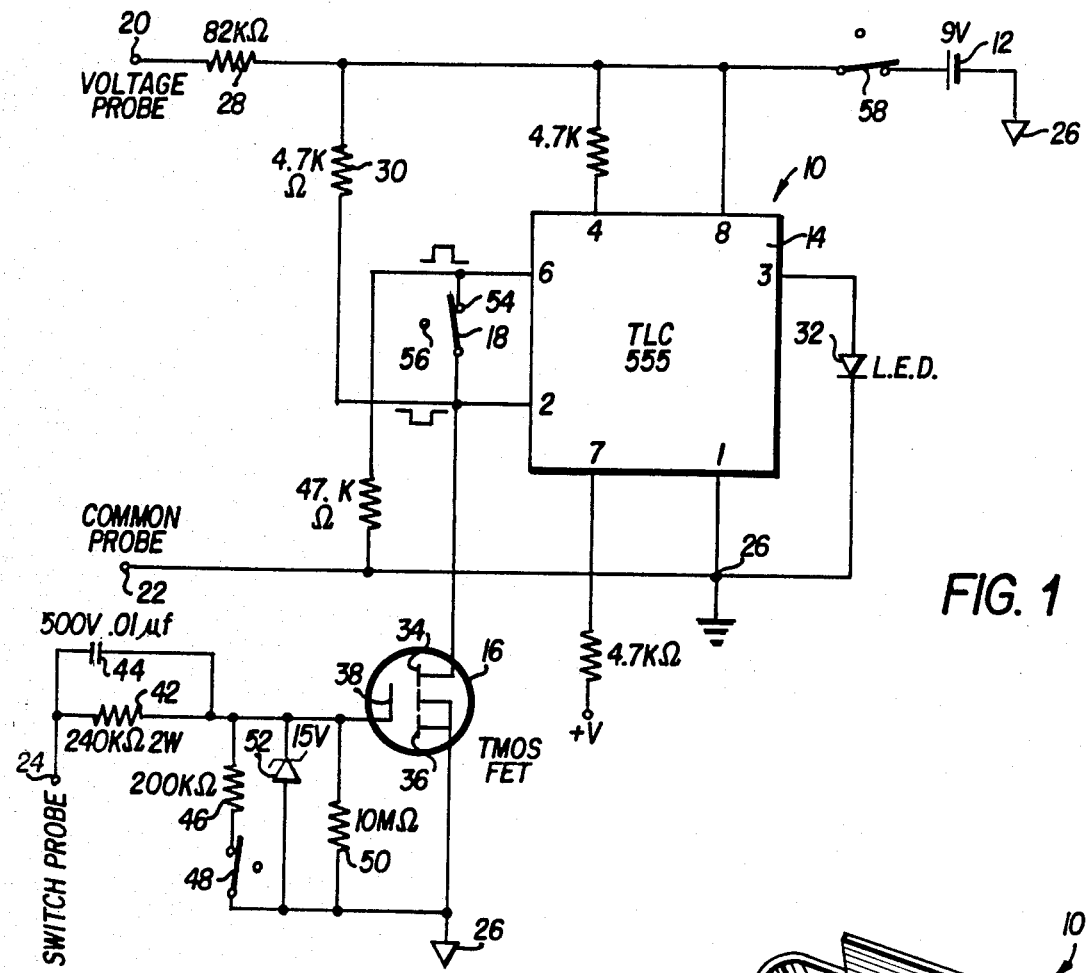
FIG. 1 is a schematic diagram of a circuit of the multi-function tester of this invention.

A multi-function tester 10 comprises mainly a voltage source 12, a bistable flip flop 14, a voltage steerable switch 16, a storage switch 18, a voltage probe 20, a common probe 22, and switch probe 24. In the preferred embodiment the voltage steerable switch 16 is a TMOS field effect transistor as shown in FIG. 1.

The voltage source 12, in the depicted embodiment, is a 9 volt battery whose negative terminal is coupled to a common, or return, terminal 26 and whose positive terminal is coupled to the voltage probe 20 through a resistor 28. The voltage source 12 is also coupled to set terminal, or pin, 2 of the bistable flip flop 14 via a set resistor 30.

With regard to the bistable flip flop 14, this circuit is a TLC555 integrated circuit which can be a Radio Shack part No. 276-1718. Terminal, or pin 6 is a reset terminal and terminal, or pin, 3 is an output terminal. In this respect, a negative going voltage appearing at set terminal, or pin, 2 will cause he flip flop 14 to move to a first state at which a high voltage appears at output terminal, or pin, 3. The bistable flip flop 14 will maintain this state and positive output at output terminal 3 until a positive going voltage appears at reset terminal 6. At this time, the flip flop 14 will switch to a second state in which no voltage appears at the output terminal 3. Thus, a negative going voltage at set terminal 2 turns on an indicator LED 32 connected between the output terminal 3 and the common terminal 26 and a positive going voltage at reset terminal 6 turns off the LED 32. Schematic pulses are indicated in FIG. 1 showing the senses of pulses at the set and reset terminals 2 and 6 for activating and deactivating the LED 32. Other terminals of the bistable flip flop 14, that is, terminals 1, 4, 7 and 8 are respectively connected to the common terminal 26, resistors, and voltage sources as indicated in FIG. 1.

In addition to being connected to the voltage source 12 through the set resistor 30, the set input 2 is also coupled to a drain terminal 34 of the TMOS field effect transistor forming the voltage steerable switch 16 and a source terminal 36 of the TMOS field effect transistor is connected to the common terminal 26. A gate terminal 38 of the TMOS field effect transistor 16 is coupled to the switch probe 24 via a 240K ohm resistor 42. A capacitor 44 allows voltage spikes to bypass the resistor 42. A 200K ohm resistor 46 forms a voltage divider between the switch probe 24 and the common terminal 26 for reducing the voltage appearing at the gate terminal 38 from that appearing at the switch probe 24 for voltage less than about 15 volts. A sensitivity switch 48 is connected in series with the resistor 46 and can be used to open the circuit so that the resistor 46 is not in the circuit, thereby making the voltage appearing at gate terminal 38 essentially the same as that appearing at switch probe 24 for voltage less than about 15 volts. A 10 meg ohm resistor 50 is coupled between the gate terminal 38 and the common terminal 26 in order to drain an electrical charge appearing at gate terminal 38 so that any voltage appearing at the switch probe 24 will not be left on the gate electrode 38 once the voltage no longer appears at the switch probe 24. A zener diode 52 limits the voltage appearing at the gate terminal 38 to 15 volts and thereby protects the TMOS FET 16.

The storage switch 18 is switchable between a closed position 54 and an open position 56 to respectively couple and decouple the set and reset input terminals 2 and 6. The purpose of this switch will be described below with the operation of the device.

An on/off switch 58 allows an operator to selectively couple or decouple the voltage source 12 to and from the rest of the circuit.

Figure 2:
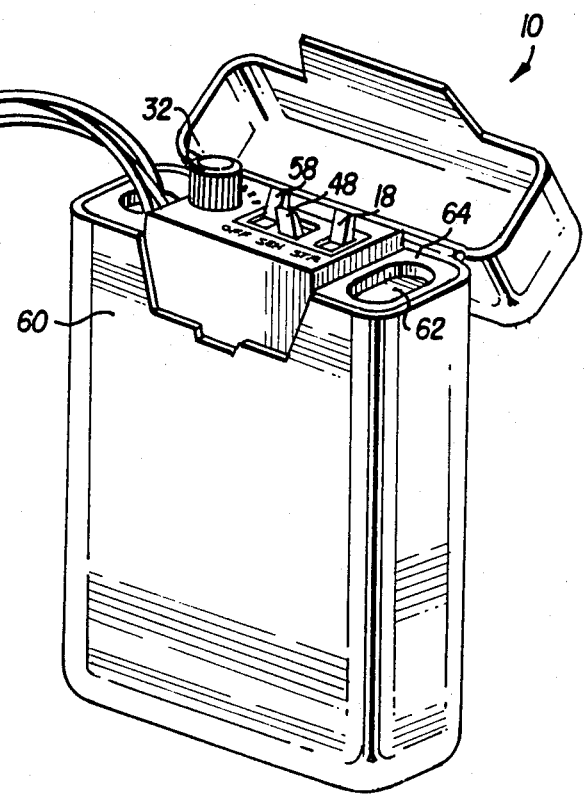
FIG. 2 is an isometric view of a multi-function tester of this invention having circuitry shown in FIG. 1.

FIG. 2 shows a multi-function tester of this invention mounted in a small container 60 with the on/off switch 58, sensitivity switch 48, and storage switch 18 thereon. As can be seen in FIG. 2, the voltage probe 20, the common probe 22 and the switch probe 24 extend from the container 60 to be brought into contact with one another and with outside circuits to be tested. The container 60 can be about 2¾ inches high, 2¼ inches wide and ¾ inch thick to be easily placed in one's pocket. A hole 62 in a circuit board support 64 allows an operator to insert one or more of the probes 20-24 thereinto when not needed.

Turning next to operation of the multi-function tester shown in FIGS. 1 and 2, the tester has many applications and only a few of them will be described herein. If it is desired to use the multi-function tester 10 to measure continuity of a circuit, the on/off switch 58 is closed, as shown in FIG. 1, the storage switch 18 is closed, also as shown in FIG. 1, and the sensitivity switch 48 can be either open or closed depending on the sensitivity desired. The voltage probe 20 is attached to one end of a circuit to be tested and the switch probe 24 is attached to the other end. Current flowing from the voltage source 12 passes from the voltage probe 20 into the circuit to be tested and if there is continuity, to the switch probe 24. Thus, the positive voltage from the battery 12 appears at the TMOS FET gate terminal 38 which causes the TMOS FET to conduct, thereby producing a negative going change in voltage at the set and reset terminals 2 and 6 of the bistable flip flop 14. This negative change appearing at the set terminal 2 causes the flip flop 14 to move to the first state and its terminal 3 to go high, thereby activating the LED 32, providing an indication that there is continuity in the circuit being tested. Once either of the voltage probe 20 or the switch probe 24 is disconnected from the circuit being tested, the voltage source 12 is no longer connected to the gate terminal 38 and any voltage appearing at gate 38 is drained off by the resistor 50. The TMOS FET 16 stops conducting which, since the storage switch 18 is closed, produces a positive going voltage at both the set and reset terminals 2 and 6. Since a positive going voltage at terminal 6 changes the flip flop 14 to the second state at which no voltage is produced at pin 3, the LED 32 is extinguished. In this mode of use, the sensitivity switch 48 can be used to change the sensitivity. If it is open it increases the sensitivity and if it is closed it reduces the sensitivity. In this regard, when the sensitivity switch 48 is open, virtually any meaningful continuity between the voltage probe 20 and the switch probe 24 will eventually build up a voltage on the gate terminal 38 to activate the LED 32 as described above. However, a very small continuity is equivalent to an open circuit for many uses, therefore, the sensitivity switch 48 will usually be in a closed position as shown in FIG. 1 so that the multi-function tester is not so sensitive. That is, a circuit being tested and the resistors 42 and 46 form a voltage divider and a voltage of at least 2.5 volts must be on the gate terminal 38 of the TMOS FET 16 in order to cause the TMOS FET to allow current flow. This will not happen for "virtually open" circuits being tested.

Describing another use of the multi-function tester 10, that of determining the presence of a voltage, with the on/off switch 58 set in the on position and the storage switch 18 set in the closed position 54 the common probe 22 is attached to one terminal of a circuit to be tested and the switch probe 24 is attached to an opposite terminal of the circuit to be tested. If there is a positive DC voltage, with switch probe 24 being attached to the positive side, the TMOS FET gate terminal 38 will go positive thereby causing the TMOS FET 16 to conduct, creating a negative-going voltage at set pin 2, and lighting the indicator LED 32 as described above. The bistable flip flop 14 will turn off the indicator LED 32, however, when the voltage source is removed because the reset input terminal 6 thereof will go in a positive voltage direction. If a circuit is thusly tested and the indicator LED 32 does not light, an operator should try opening the sensitivity switch 48, which will cause the circuit to respond to a lower voltage, that is, one below 5 volts. If the indicator LED 32 still does not light, it could mean that there is no voltage on the tested circuit or that the voltage is minus rather than positive. To eliminate the possibility that there is a minus voltage, the operator reverses the positions of the common probe 22 and the switch probe 24. When the common probe 22 is attached to a negative voltage, and the switch probe 24 is attached to a 0 voltage, the TMOS FET 16 will again conduct and will thereby light the indicator LED 32. In this manner, an operator can determine not only if there is a voltage, but whether the voltage is in a range of above around 5 volts or less than 5 volts and the polarity of the voltage. That is, for example, an operator can test for the presence of positive or negative logic signals, and can determine if they are in size ranges of 5 volts or higher.

The multi-function tester of this invention can also be used for testing itself. In this regard, if the voltage probe 20 is contacted to the switch probe 24 only, the LED 32 should be lit. However, if the voltage probe 20 is contacted to the common probe 22 and the switch probe 24 together, with the storage switch 18 closed, the LED 32 should then be extinguished because both pins two and six of the bistable flip flop 14 will go in a positive direction. This test can be done either with the sensitivity switch 48 open or closed to provide an indication of the amount of voltage put out by the battery 12.

Turning now to use of the multi-function tester 10 for determining the existence of isolated spikes, this is done by moving the storage switch 18 to the open position 56. The common probe 22 is then attached to one lead of a circuit to be tested and the switch probe 24 is attached to the other lead. If a positive spike appears on the switch probe 24, this will momentarily cause the voltage steerable switch 16 (TMOS FET) to conduct which will, momentarily, cause the set pin 2 of the bistable flip flop 14 to go negative, thereby placing the flip flop 14 in the first state and illuminating the indicator LED 32. However, when the voltage steerable switch 16 stops conducting, which it does at the end of the pulse, only the set pin 2 moves in the positive direction, and not the reset pin 6 as when the storage switch 18 was closed. Thus, the bistable flip flop 14 stays in the first state with pin 3 being high and the indicator LED 32 being illuminated, and is not reset to the second state. The bistable flip flop 14 can be reset in various ways, including closing the storage switch 18 and reopening it.

This same storage technique can be used for determining if an electrical voltage is momentarily passed through a line when an operator must be at a sending end of the line and the multi-function tester 10 is at the other end. That is, the multi-function tester 10 is put in the storage mode, with storage switch 18 in the open position. The common probe 22 and the switch probe 24 are connected to a circuit and the operator sends a momentary voltage, or isolated pulse, through the circuit. Finally, the operator checks the indicator LED 32 to see if it was lit by the momentary pulse of electricity.

Yet another extraordinary use of this multifunction tester is to roughly locate breaks in a circuit, which is also done with the storage switch 18 in the open position 56. In this respect, normally, if there is a two wire circuit and the wires are connected to terminals at opposite ends, any break in the circuit will most likely be at the terminals. It is possible to determine at which end the break is located by attaching the voltage probe 20 to a first wire at one end, and the common probe 22 to the second wire at the same end. Basically, this places a charge on the two wires which serve as a capacitor. The voltage probe 20 is then moved to the second wire, which is at zero potential, and the switch probe 24 is placed on the first wire. This makes the first wire even more positive and a high positive electrostatic signal will appear on the gate terminal 38. If neither wire is broken at the end from which the test is run, there will be sufficient voltage on the wires to turn on the TMOS FET 16, however, if the break is at the end of the wires at which the multi-function tester 10 is located there will be insufficient voltage on the wires and the switch will not be turned on. Thus, if LED 32 lights up it indicates that the break is at the other end, and if it does not light up, the break is at the end tested. This test can best be done with the storage switch 18 open because the voltage created at the gate terminal 38 is fleeting and if the indication were not stored the "on" time of the LED 32 is so short that it is difficult to ascertain.

Looking now at yet another extraordinary use of the multi-function tester of this invention, because the TMOS FET 16 operates not on current flow from a voltage being tested through the tester, but rather on electrostatic voltage, the multi-function tester 10 can actually be used to determine if a voltage appears on a terminal by only attaching the switch probe 24 to the terminal. If a sufficient voltage appears on the terminal, the TMOS FET 16 will begin to conduct, thereby lighting up the LED 32. This technique is extremely useful for determining which terminal of a house outlet is hot and which one is the common. The hot terminal will cause the LED 32 to light, whereas the common one will not. Yet another aspect of the "one-terminal-connection" is that it can be used for detecting extremely high voltage without damaging the multi-function tester 10. Also, this technique can be used where two terminals are not easily available. An example of this is, for example, determining if there is an electrostatic charge on a vehicle body where it is difficult to attach a probe to a ground. Once such a test is run it is necessary to allow the multi-function tester 10 to "rest" for a short period of time to allow static electricity thereby left on the multi-function tester 10 to dissipate. Such tests can best be run with the storage switch 18 in the open 56 position because an initial relative charge placed on the gate terminal 38 will be fleeting, since it will flow to the common terminal 26 through the resistor 50. Once both the gate terminal 38 and the common terminal 26 become charged the TMOS FET 16 turns off, but the flip flop 14 will be left in the first state if storage switch 18 is open.

It will be understood by those of ordinary skill in the art that only some of the many uses for the multi-function tester of this invention have been set forth herein and that many more exist.

In any event, from the above description it can be seen that the multi-function tester of this invention: can store an indication (provides a continual indication), can indicate which end of a cable has a break therein, can indicate which contact of a receptacle is connected to a high side of a power supply, can extend a voltage level above that allowed by two wire voltage testing, can test for voltage where only a hot wire can be reached, can detect an electrostatic charge, can be used for conducting a self test, and can be easily carried in a pocket because it occupies such little space.

While the invention has been particularly shown and described with reference to a preferred embodiment, it will be understood by those skilled in the art that various changes in form and detail may be made therein without departing from the spirit and scope of the invention. For example, it would be possible to include a switch connected between the 15 volt zener diode 52 and the common terminal 26 which, when opened, would provide larger readings at the gate terminal for larger voltages appearing at the switch probe. However, this would be dangerous because there would be no protection for the voltage steerable switch (TMOS FET) 16. In this regard, as the circuit is depicted in FIG. 1, the zener diode 52 protects the TMOS FET from up to 1000 volts appearing at the switch probe 24 in a one probe test. Regarding the TMOS FET, oddly the invention does not appear to operate properly with a straight FET, but rather a MOS FET appears to be necessary.

The embodiments of the invention in which an exclusive property or privilege are claimed are defined as follows:

1. A multi-function tester for testing for electrical continuity and the presence of various types of voltages comprising:
   a DC voltage source for providing electrical DC-voltage;
   a bistable flip flop circuit having a set input terminal, a reset input terminal, and an output terminal, said output terminal being switchable between a first output voltage-level state and a second output voltage-level state by application of respective voltage changes at said set and reset input terminals, said bistable flip flop circuit being coupled to said DC voltage source and powered thereby, said set input terminal also being coupled to a set voltage divider circuit extending between said DC voltage source and a common terminal, said set voltage divider circuit having a set fixed resistor therein;
   an indicator means coupled between said output terminal and said common terminal for producing a detectable output when said first output voltage level appears at said output terminal;
   a voltage steerable switch means coupled in said set voltage divider circuit for selectively immediately decreasing a switch impedance in response to a steering voltage of a first magnitude being applied to a switching terminal thereof and immediately increasing said switch impedance in response to a steering voltage of a second magnitude being applied to said switching terminal thereof to thereby change the voltage appearing at said set input terminal to move said flip flop between said first and second output voltage level state;
   a voltage probe coupled to said voltage source;
   a common probe coupled to said common terminal;
   a switching probe coupled to said switching terminal;
   wherein each of said voltage, common and switching probe can be selectively brought into contact with each other and can be brought into contact with electrical circuits to be tested;
   whereby voltage signals from both said DC voltage source and from outside sources can be placed on said switching terminal with said voltage, common and switching probes, both directly and through other circuits, for immediately changing the voltage at said flip flop circuit set input terminal in a sense for causing said first level voltage to appear at said output terminal to thereby cause said indicator means to produce a detectable output and voltage signals can be removed from said switching terminal for immediately changing the voltage at said flip-flop circuit set input terminal in a sense for causing said second level voltage to appear at said output terminal to thereby extinguish said indicator means.

2. A multi-function tester as in claim 1 wherein, said voltage steerable switch is a TMOS field effect transistor.

3. A multi-function tester as in claim 1 wherein, is further included a storage switch between said set and reset input terminals for being opened and closed and wherein said bistable flip flop circuit responds to oppositely directed voltage changes at said set and reset input terminals for respectively switching said output terminal between said first and second output voltage levels, said second level output voltage level extinguishing said detectable output.

4. A multi-function tester as in claim 3 wherein, said voltage steerable switch is a TMOS field effect transistor.

5. A multi-function tester as in claim 3 wherein, is further included a voltage divider circuit between said switching probe and said common probe.

6. A multi-function tester as in claim 5 wherein, is further included a sensitivity switch in series with said voltage divider resistor positioned between said switching probe and common terminal.

7. A multi-function tester as in claim 6 wherein, said voltage steerable switch is a TMOS field effect transistor.

8. A multi-function tester as in claim 1 wherein, it is further included a voltage divider circuit between said switching probe and said common probe.

9. A multi-function tester as in claim 8 wherein, is further included a sensitivity switch in series with said voltage divider resistor positioned between said switching probe and common terminal.

10. A multi-function tester as in claim 8 wherein, said voltage steerable switch is a TMOS field effect transistor.

11. A multi-function tester as in claim 1 wherein, said indicator means is a light-emitting diode.

* * * * *